United States Patent [19]

Kameya

[11] Patent Number: 4,546,332

[45] Date of Patent: Oct. 8, 1985

[54] VARIABLE DELAY LINE

[75] Inventor: Kazuo Kameya, Tsurugashima, Japan

[73] Assignee: Elmec Corporation, Saitama, Japan

[21] Appl. No.: 573,746

[22] Filed: Jan. 25, 1984

[30] Foreign Application Priority Data

Jan. 27, 1983 [JP] Japan ............................ 58-10396[U]

[51] Int. Cl.[4] ......................... H01P 9/00; H03H 7/32; H03H 7/34

[52] U.S. Cl. .................................... 333/139; 333/140; 333/156; 333/162

[58] Field of Search .......................... 333/23, 138-140, 333/28 R, 18, 156, 162; 336/137, 148-150

[56] References Cited

U.S. PATENT DOCUMENTS

| | | | |
|---|---|---|---|
| 920,925 | 5/1909 | Darlington | 336/149 X |
| 1,460,239 | 6/1923 | Gehrig | 336/149 |
| 2,463,105 | 3/1949 | Henniker | 336/149 X |
| 3,740,673 | 6/1973 | Bernstein | 333/162 |

*Primary Examiner*—Marvin L. Nussbaum
*Attorney, Agent, or Firm*—Sughrue, Mion, Zinn, Macpeak, and Seas

[57] ABSTRACT

A variable delay line is disclosed which comprises an electromagnetic delay line formed of an inductance element and capacitors, a conductive plate disposed along the electromagnetic delay line and opposed thereto, and a movable contact adapted to move along the delay line while remaining in continuous contact with the conductive plate and the inductance element. The variable delay line has its delay characteristics improved by bending the aforementioned conductive plate in such a manner that it is separated from the delay line along the contact parts exposed to contact with the movable contact and, as a result, the stray capacitance formed between the delay line and the conductive plate is kept down to a negligibly small level.

10 Claims, 7 Drawing Figures

VARIABLE DELAY LINE

BACKGROUND OF THE INVENTION (1) Field of the Invention

This invention relates to an electromagnetic variable delay line combining an inductance element and capacitors, and more particularly to improvements in and concerning a variable delay line capable of finely changing the delay time in ultra-high speed signals.

(2) Description of the Prior Art

Among the variable delay lines developed to date for changing the delay time in ultra-high speed signals, involving an ultra-high speed rise time of the order of not more than 1 ns, there are counted those of recent development which are constructed as described below.

The structure involves space coiling a conductor in the shape of a single-layer solenoid to form an inductance element, connecting a plurality of capacitors between the inductance element and ground to form an electromagnetic delay line consisting of a plurality of sections, disposing a conductive plate along the delay line in a manner opposed thereto, disposing a movable contact between the conductive plate and the delay line, held resiliently in contact with the conductive plate and the conductor, and adapting the movable contact to be freely movable in the axial direction of the delay line.

In the variable delay line of the foregoing description, the length of the conductor defined by the movable contact can be changed by moving the movable contact as required. When an ultra-high speed signal is fed to the conductive plate, for example, this signal is applied through the movable contact to the delay line and fed out with an interval of delay time proportionate to the number of sections of the delay line falling between the points of input and output. By moving the movable contact, therefore, the delay time of the output signal can be finely changed.

With the conductive plate adapted such that the movable contact remains constantly in contact with the conductive plate even during its movement, however, since this conductive plate is disposed face to face with the delay line throughout the entire length thereof, there is inevitably formed a stray capacitance between the inductance element of the delay line and the conductive plate, throughout the entire length of the conductive plate.

In the actual manufacture of the variable delay line, the conductive plate is liable to be formed as a relatively large element because it is desired to be easily supported in position. The movable contact is liable to be formed as a small sized element because it is required to permit desired changes in the delay time of ultra-high speed signals without entailing any loss. Consequently, the space between the inductance element and the conductive plate tends to become excessively narrow and the stray capacitance too large to be ignored. When the stray capacitance increases beyond a certain level, it begins to exert very serious adverse effects upon the delay characteristics of the delay line, such as distortion of the waveform of the output pulses from the variable delay line and retardation in the rise time.

These effects which the stray capacitance exerts upon the delay characteristics are aggravated when the adjustment is made in the direction of increasing the delay time, i.e. by moving the movable contact away from the output terminal of the delay line. Thus, the delay characteristics are varied by the change in the delay time. There are times when use of an inductance element obtained by winding a conductor around a flat bobbin proves desirable in the sense that the inductance element will be more easily fixed in position. In this case, the adverse effects of the stray capacitance become more prominent because the conductive plate and the conductor are opposed to each other over a much larger area.

SUMMARY OF THE INVENTION

This invention has been perfected in due consideration of state of affairs as described above.

A primary object of this invention is to provide a variable delay line which enables the delay characteristics, particularly in terms of the distortion of output waveform and retardation of the rise time, to be advantageously improved by causing the stray capacitance formed between an inductance element and a conductive plate to be kept down to a negligibly low level.

Another object of this invention is to provide a variable delay line which enables adverse changes in the delay characteristics in terms of the distortion of output waveform and retardation of the rise time, due to a change in the delay time, to be suppressed to a minimal level.

Yet another object of this invention is to provide a variable delay line which exhibits high mechanical strength and stable delay characteristics.

A further object of this invention is to provide a variable delay line which admits no ready change in the delay time once the delay time is adjusted.

To accomplish these objects according to this invention, there is provided a variable delay line which comprises an inductance element formed of a conductor, capacitors adapted in conjunction with the inductance element to form an electromagnetic delay line, a conductive plate disposed along the inductance element and opposed thereto, a fixed contact row consisting of a plurality of fixed contacts formed on the aforementioned conductor at positions opposed to the conductive plate, and a movable contact adapted to be moved on the aforementioned fixed contact row, to successively contact the aforementioned fixed contacts while keeping continuous contact with the conductive plate, and this variable delay line is characterized by the fact that the conductive plate is bent in a direction such that it is separated from the inductance element along the parts of the conductive plate exposed to contact with the movable contact.

In accordance with the construction of this invention described above, since only the portion of the conductive plate with which the movable contact comes into contact is disposed near the inductance element, the stray capacitance formed between the conductive plate and the inductance element can be suppressed to an extremely small value. In fact, the stray capacitance is so small that its existence may be ignored.

As a result, the variable delay line of this invention can retain advantageous delay characteristics in terms of distortion of the output waveform and retardance of the rise time. Moreover, the movement of the movable contact does not readily affect the distortion of the output waveform and the retardance of the rise time.

The aforementioned objects, other objects, and the chrcteristic features of this invention will become apparent from the further disclosure to be given in the following description, with reference to the accompanying drawings.

DETAILED DESCRIPTION OF THE PREFERRED EMBODIMENT

Now, the present invention will be described in detail.

To facilitate comprehension of the characteristics of this invention, the conventional variable delay line will be specifcally described.

Figure 1:
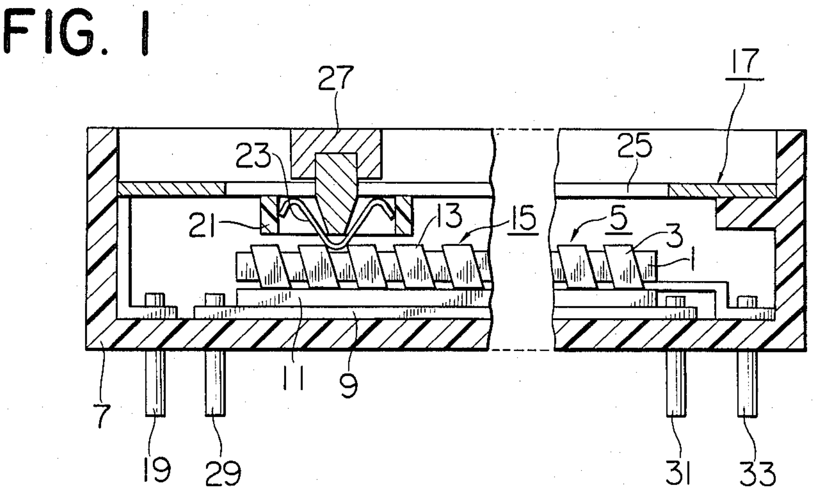
FIG. 1 is a front view (partially sectioned) illustrating a conventional variable delay line.
Figure 2:
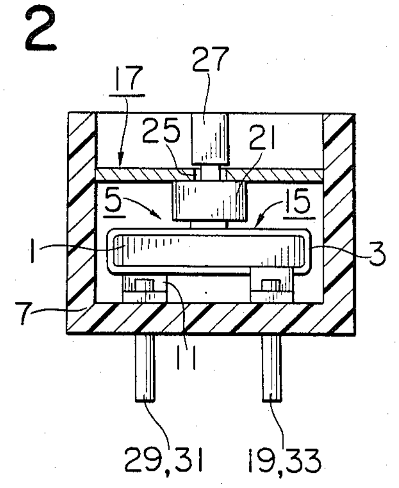
FIG. 2 is the side view (partially sectioned) illustrating a conventional variable delay line of FIG. 1.

FIG. 1 and FIG. 2 are a front view and a side view (partially sectioned) illustrating the construction of the conventional variable delay line. As shown in these diagrams, a conductive strip 3 is space coiled in the shape of a single-layer solenoid around a non-magnetic bobbin 1 in the shape of a bar to form an inductance element 5. This inductance element 5 is horizontally superposed on a dielectric plate 11 formed through the medium of a ground plate 9 on the bottom of a case 7 having a completely open upper end. The portions of the coiled conductive strip 3 arranged on the upper side of the bobbin 1 are used as fixed contacts 13.These fixed contacts 13 jointly form a fixed contact row 15.

Halfway up the depth of the case 7 above the inductance element 5, a conductive plate 17 is supported in a position opposed to the inductance element 5 in a manner covering the case 7. One end of this conductive plate 17 is connected to an input terminal 19 connected through the bottom of the case 7. A holder 21 in the shape of a frame is interposed between the inductance element 5 and the conductive plate 17. Inside this holder 21, a movable contact spring 23 is placed in such a manner that it may be resiliently brought into contact with the fixed contacts 13 and the conductive plate 17. A part of the holder 21 is projected upwards through a slit 25 formed in the conductive plate 17 along the fixed contact row 15. A knob 27 is attached to the projected part of the holder 21.

Figure 3:
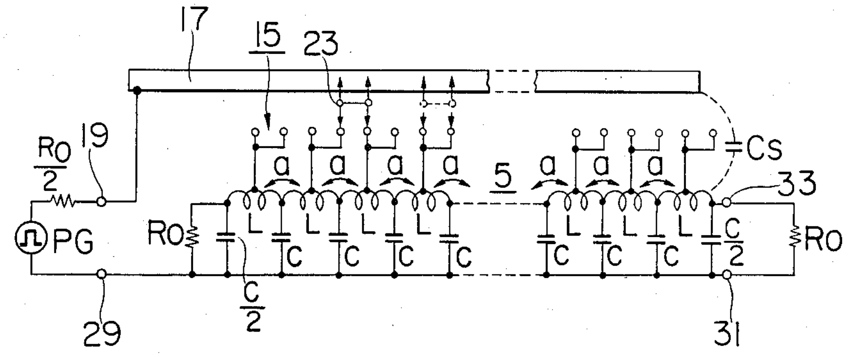
FIG. 3 is an equivalent circuit diagram of the variable delay line.

The symbols 29, 31 denots ground terminals and the symbol 33 denotes an output terminal. FIG. 3 is an equivalent circuit diagram.

Figure 4:
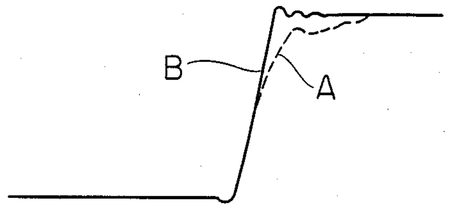
FIG. 4 is a diagram of an output waveform of the variable delay line.

In this variable delay line, a stray capacity Cs exists between the inductance element 5 and the conductive plate 17 as illustrated in the equivalent circuit of FIG. 3. Although the stray capacitance Cs is collectively illustrated at the right end in FIG. 3, it actually exists throughout the entire length of the conductive plate 17. Moreover, because the conductive plate 17 is wide enough to cover the open end of the case 7, the output pulse response waveform has its rise characteristics degraded as indicated by the broken line A in the diagram of FIG. 4. This degradation of the delay characteristics becomes quite prominent when this broken line A is compared with the solid line B shown in FIG. 4 and representing the output pulse response waveform fed from a fixed delay line not provided with the conductive plate 17.

The present invention is aimed at keeping down to a minimal value the stray capacitance Cs occurring in the variable delay line by altering the structure of the conductive plate with which the movable contact spring 23 comes into contact.

Now, a typical example of the variable delay line of the present invention will be described in detail. The same parts as those used in the conventional variable delay line described above will be denoted by the identical symbols.

Figure 5:
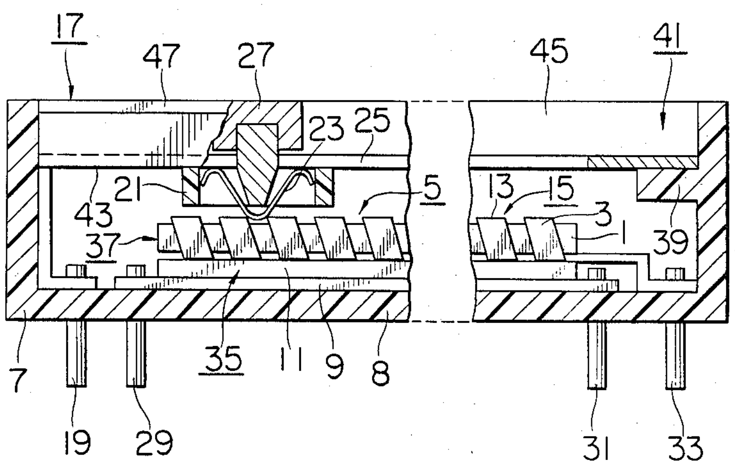
FIG. 5 is a front view (partially sectioned) illustrating a typical example of a variable delay line of the present invention.
Figure 6:
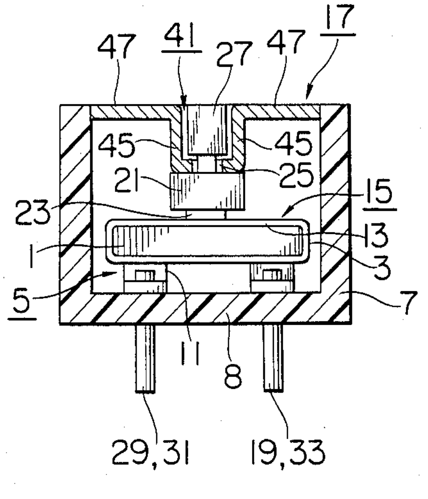
FIG. 6 is a side view (partially sectioned) of the variable delay line of FIG. 5.

FIG. 5 and FIG. 6 are a front view and a side view illustrating a typical example of the variable delay line of the present invention. These diagrams illustrate the variable delay line in partial section. As illustrated in these diagrams, a conductive strip 3 is space coiled in the shape of a single-layer solenoid around the periphery of a non-magnetic bobbin 1 in the shape of a bar having a flat rectangular cross section, to form an inductance element 5. On the inner bottom surface of a synthetic resin case 7 formed in the shape of a box having a completely open upper end, a slender dielectric plate 11 is formed through the medium of a ground plate 9. On this dielectric plate 11, the inductance element 5 is superposed.

As a result, a plurality of capacitors 35 are formed by the dielectric plate 11 held between the ground plate 9 and the lower portions of the conductive strip 3 of the inductance element 5, and a lumped-constant type delay line 37 is formed by the capacitors 35 connected between the conductive strip 3 and ground, one for each individual turn of the inductance element 5. Thus, the delay line 37 has a plurality of sections.

The upper sides of the conductive strip 3 of the inductance element 5 function as fixed contacts 13. These fixed contacts 13 one formed at each of the successive turns of the conductive strip 3, together constitute a fixed contact row 15 running along the axial direction (longitudinal direction) of the inductance element 5. In a bottom plate 8 of the case 7, the input terminal 19, input and output ground terminals 29, 31 connected to the ground plate 9, and an output terminal 33 connected to the end of the coiled conductive strip 3 are implanted. The leading end of the coiled conductive strip 3 is connected via a resistor Ro (not shown) to the ground plate 9.

A supporting piece 39 is projected from the lateral wall of the case 7 at a point falling above the delay line 37 and halfway up the height of the case 7, and a conductive plate 17 is disposed in such a manner as to cover the upper open end of the case 7, with one end of the conductive plate 17 extended along the inner lateral wall surface of the case 7 and connected to the aforementioned input terminal 19.

The conductive plate 17 has its central portion bent to form a rectangular groove 41 extending along the fixed contact row 15. It is supported in position with a bottom part 43 of the groove 41 arranged near the fixed contact row 15 and resting fast on the supporting piece 39. In this bottom part 43, a slit 25 is formed along the fixed contact row 15. To be more specific, the conductive plate 17 is formed to have a groove 41, and the bottom part 43 of the groove 41 is arranged close to the inductance element 5. The area of the conductive plate 17 positioned near the inductance element 5 is minimized. Upright pieces 45 of the groove 41 are disposed near a knob 27 which will be more fully described afterward, and covering parts 47 are formed by bending the upper sides of the upright pieces 45 towards the edges of the opening of the case 7. The two upright pieces 45 form guide walls for the movement of the knob 27.

Figure 7:
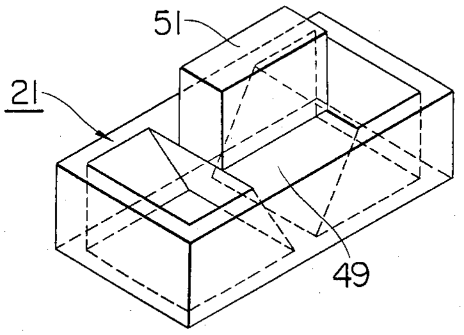
FIG. 7 is a perspective view illustrating the holder shown in FIG. 5.

A holder 21 is disposed between the bottom part 43 of the conductive plate 17 and the upper side of the inductance element 5. This holder 21, as illustrated in FIG. 7, is in the shape of a frame and incorporates a partition 49 serving to divide the frame of the holder in the middle thereof, and a projecting part 51 raised upwardly from the central upper side of the partition 49. The projecting part 51, as illustrated in FIG. 5, is thrust through the slit 25 into the groove 41, with the knob 27 attached to the thrust end of the projecting part 51 within the groove 41. Consequently, the holder 21 is supported in position with the conductive plate 17 being held between the upper side of the holder 21 and the lower side of the knob 27. The upper end surface of the knob 25 is flush with the covering parts 47 of the conductive plate 17.

Inside the holder 21, a movable contact spring 23 bent substantially in the shape of a bow as illustrated in FIG. 5 and intended to function as a movable contact is set in position, with the central bulged portion thereof held resiliently in contact with the fixed contacts 13 and the opposite ends thereof held resiliently in contact with the bottom part 43 of the groove 41.

By moving this knob 27 within the groove 41, the holder 21 is caused to move in conjunction with the movable contact spring 23 and the movable contact spring 23 repeatedly comes into contact with the successive fixed contacts 13 while keeping continuous contact with the lower side of the bottom part 43. Thus, the lower side of the bottom part 43 of the conductive plate 17 functions as a contact part of the movable contact spring 23.

The variable delay line structure as described above has an equivalent circuit as illustrated in FIG. 3 and possesses a plurality of sections each formed of capacitances C of capacitors 35 and the inductance L, which inductance L corresponds to one turn of the inductance element 5. The movable contact spring 23 indicated by the solid line in FIG. 3 is shown as being simultaneously in contact with two adjacent fixed contacts 13, while the movable contact spring indicated by the broken line is shown as being in contact with one fixed contact 13. In the diagram, the symbol "a" represents the coupling coefficient between the adjacent inductances L.

The variable delay line of the present invention is such that when the knob 27 is moved within the groove 41 with the opposed upright pieces 45 serving as guide walls therefor, the conductive plate 17 connected to the input terminal 19 is brought into contact with a freely selected one or two of the fixed contacts 13. As an ultra-high frequency signal is applied to the input terminal 19, therefore, a delay time which is varied stepwise by a prescribed time difference is obtained at the output terminal 31. Optionally, fixed contacts 13 may be formed for every plurality of turns only. In this case, the delay time is incrementally varied by a larger time difference corresponding to the particular plurality of turns. The fixed contacts 13 may be formed by causing part of the conductive strip 3 of the inductance element 5 to be projected or by drawing similar projections from the inductance element 5.

In the variable delay line constructed as described above, the bottom part 43 of the groove 41 formed in the conductive plate 17 is allowed to be disposed near the inductance element 5 while the other part of the conductive plate 17 is shaped as upright pieces 45 and is consequently separated from the inductance element 5. Consequently, the distance between the major part of the conductive plate 17 and the inductance element 5 is large.

As the result, the stray capacitance Cs formed between the inductance element 5 and the conductive plate 17 is very small and, therefore, may be ignored. The variable delay line, accordingly, is enabled to retain advantageous delay characteristics without entailing any degradation, in terms of distortion of the output waveform and retardation of the rise time. The delay characteristics in terms of distortion or retardatation are not easily affected even when the movable contact spring 23 is moved. The delay characteristics exhibited by this variable delay line, for example, are very close to the output pulse response waveform indicated by the solid line B in FIG. 4.

In the typical example described above, the inductance element 5 is indicated as being formed by coiling the conductive strip 3 around a bobbin 1. Optionally, it may be formed by coiling a conductive wire instead. Alternatively, the inductance element 5 may be formed by depositing a conductor layer on the periphery of the bobbin and etching the conductor layer by any of the known means so as to form a coil in the shape of a solenoid. Otherwise, a plurality of coils each consisting of a plurality of turns may be serially connected and fixed contacts may be formed at points where the successive coils are connected. Use of the bobbin 1 itself is not essential. Besides being embodied in a structure using the inductance element formed by coiling a conductor as described above, the present invention can be embodied in the form of a distributed-constant type impedance line comprising a conductor line and a distributed capacitance formed between the conductor line and the ground, such as, for example, a distributed-constant type variable delay line making use of a microstrip line.

The knob 27 disposed on the movable contact spring 23 is meant as a member for the operation of the movable contact spring 23. It, therefore, may be formed integrally with the movable contact spring 23. It is, however, desirable for the knob 27 and the movable contact spring 23 to be formed separately and subsequently joined to each other through the medium of an insulating member, so that the variable delay line may have stabilized characteristics.

As regards the aforementioned conductive plate 17, two upright pieces 45 are formed therein. Optionally, only one upright piece 45 may be formed in the conductive plate 17. What is essential to the accomplishment of the objects of this invention is the fact that the conductive plate 17 is bent in such a manner that it is separated from the inductance element 5 along the contact parts thereof.

In the present invention, when the conductive plate 17 is formed integrally with the covering parts 47 at the upper ends of the upright pieces 45 as illustrated in FIG. 6, it acquires improved mechanical strength and a stabilized delay characteristic and permits reduction in the thickness thereof. Further when the upper ends of the upright pieces 45 are allowed to fall flush with the upper end surface of the knob 27, the knob 27 cannot be easily moved from outside. Once it has been moved to adjust the variable delay line, it cannot be easily moved except for readjustment of the variable delay line. When a strip of adhesive tape is applied to the covering parts 47 so as to conceal the groove 41, it can prevent the entry of dust into the groove 41 and, at the same time, safely preclude the movement of the knob 27 after adjustment.

What is claimed is:

1. A variable delay line, comprising; an inductance element formed of a conductor, capacitor means arranged in conjunction with said inductance element to form an electromagnetic delay line, a conductive plate disposed along said delay line and facing one surface of said delay line, a fixed contact row comprising a plurality of fixed contacts formed on said conductor at positions facing said conductive plate, and a movable contact adapted to be movable along said fixed contact row so as to successively contact said fixed contacts of said row while maintaining continuous contact with said conductive plate, said conductive plate having a first portion substantially spaced from said inductive element, at least one bent portion extending from said first portion toward said inductance element, and at least one portion in contact with said movable contact and having a relatively smaller spacing from said inductive element.

2. A variable delay line according to claim 1, wherein said inductance element comprises a coiled conductor.

3. A variable delay line according to claim 2, wherein said inductance element comprises a conductor coiled in the shape of a single-layer solenoid.

4. A variable delay line according to claim 2, wherein said inductance element comprises a plurality of serially connected coils, each having a plurality of turns.

5. A variable delay line according to claim 1, wherein said inductance element comprises a distributed-constant type impedence line, said conductor comprising a conductor line of said impedence line, and said capacitor means comprising a distributed capacitance formed between said conductor line and a ground.

6. A variable delay line, comprising; an inductance element formed of a conductor, capacitor means arranged in conjunction with said inductance element to form an electromagnetic delay line, a conductive plate disposed along said delay line and facing one surface of said delay line, a fixed contact row comprising a plurality of fixed contacts formed on said conductor at positions facing said conductive plate, a movable contact adapted to be movable along said fixed contact row so as to successively contact said fixed contacts of said row while maintaining continuous contact with said conductive plate, and an operating member projecting through a slit formed in said conductive plate, said slit being formed in the direction of movement of said movable contact, said operating member being operatively connected to said movable contact and being jointly movable therewith along said slit, said conductive plate including a first portion substantially spaced from said inductance element, a second portion bent in a direction toward said inductance element, and a third portion in contact with said movable contact and defining said slit, and having a relatively smaller spacing from said inductive element.

7. A variable delay line according to claim 6, wherein said first portion of said conductive plate comprises covering pieces extending to either side of said operating member.

8. A variable delay line according to claim 7, wherein said covering pieces are positioned so as to fall flush with an upper end of said operating member.

9. A variable delay line according to claim 6, wherein said inductance element comprises a coiled conductor.

10. A variable delay line according to claim 6, wherein said inductance element comprises a distributed-constant type impedence line, said conductor comprising a conductor line of said impedence line, and said capacitor means comprising a distributed capacitance formed between said conductor line and a ground.

* * * * *